(12) United States Patent
Alapati et al.

(10) Patent No.: US 11,133,642 B2
(45) Date of Patent: *Sep. 28, 2021

(54) SEMICONDUCTOR DEVICE AND METHOD OF MANUFACTURING A SEMICONDUCTOR DEVICE

(71) Applicant: Amkor Technology Singapore Holding Pte. Ltd, Valley Point (SG)

(72) Inventors: Ramakanth Alapati, Dublin, CA (US); Darrell Paul Baker, San Jose, CA (US); Anthony B. Taguinod, Chandler, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,334

(22) Filed: May 5, 2020

(65) Prior Publication Data

US 2020/0274319 A1     Aug. 27, 2020

Related U.S. Application Data

(63) Continuation of application No. 16/283,752, filed on Feb. 23, 2019, now Pat. No. 10,644,479.

(51) Int. Cl.
*H01S 5/02208* (2021.01)
*H01S 5/02234* (2021.01)
*H01S 5/02345* (2021.01)

(52) U.S. Cl.
CPC ...... *H01S 5/02208* (2013.01); *H01S 5/02234* (2021.01); *H01S 5/02345* (2021.01)

(58) Field of Classification Search
USPC .............. 257/99, 433; 372/50.1, 29.022, 103
See application file for complete search history.

(56) References Cited

U.S. PATENT DOCUMENTS

| | | | | |
|---|---|---|---|---|
| 5,052,005 A | * | 9/1991 | Tanaka | G11B 7/127 372/36 |
| 5,177,753 A | * | 1/1993 | Tanaka | G02B 6/4212 372/36 |
| 5,218,611 A | * | 6/1993 | Tanaka | H01S 5/022 372/36 |

(Continued)

FOREIGN PATENT DOCUMENTS

| DE | 102012215684 A1 | 3/2014 |
|---|---|---|
| WO | 2011132599 A1 | 10/2011 |

*Primary Examiner* — Tuan N Nguyen
(74) *Attorney, Agent, or Firm* — Kevin B. Jackson

(57) ABSTRACT

A packaged electronic device structure includes a substrate having a major surface. A semiconductor device is connected to the major surface of the substrate, the semiconductor device having a first major surface, a second major surface opposite to the first major surface, and a side surface extending between the first major surface and the second major surface. A package body encapsulates a portion of the semiconductor device, wherein the side surface of the semiconductor device is exposed through a side surface of the package body. In some examples, the side surface of the semiconductor device is an active surface. In some examples, the package body comprises a molded structure that contacts and overlaps the first major surface of the semiconductor device.

19 Claims, 10 Drawing Sheets

(56) References Cited

U.S. PATENT DOCUMENTS

| | | | | |
|---|---|---|---|---|
| 5,226,052 A | * | 7/1993 | Tanaka | H01S 5/02325 |
| | | | | 372/36 |
| 6,784,511 B1 | * | 8/2004 | Kunihara | H01S 5/02326 |
| | | | | 257/433 |
| 9,379,517 B2 | | 6/2016 | Wojcik | |
| 10,644,479 B1 | * | 5/2020 | Alapati | H01S 5/02234 |
| 2003/0026720 A1 | * | 2/2003 | Lee | F04C 28/28 |
| | | | | 418/55.2 |
| 2014/0008778 A1 | | 1/2014 | Zhang | |
| 2017/0353004 A1 | | 12/2017 | Chen | |

* cited by examiner

SEMICONDUCTOR DEVICE AND METHOD OF MANUFACTURING A SEMICONDUCTOR DEVICE

CROSS-REFERENCE TO RELATED APPLICATIONS

This application is a continuation of co-pending U.S. patent application Ser. No. 16/283,752 filed on Feb. 23, 2019, and issued as U.S. Pat. No. 10,644,479 on May 5, 2020, which is expressly incorporated by reference herein and priority thereto is hereby claimed.

BACKGROUND OF THE DISCLOSURE

The present disclosure relates, in general, to electronics, and more particularly, to semiconductor packages, structures thereof, and methods of forming semiconductor packages.

Prior semiconductor packages and methods for forming semiconductor packages are inadequate, for example resulting in excess cost, poor thermal performance, decreased reliability, relatively low performance, or package sizes that are too large. More particularly, some packaged semiconductor devices include semiconductor devices, such as sensor or optical devices that require exposing one or more side surfaces of the devices, which are active surfaces, to the outside of the package. Such devices include, for example, laser devices that can be incorporated into light detection and ranging ("LIDAR") systems. Previous methods used to produce packaged semiconductor devices with one or more side surfaces of the semiconductor device exposed have yielded poor results with problems including damage to the semiconductor device and conductive interconnects, such as wire bonds. In addition, the conductive interconnects have been left exposed to the environment through the open side surface or within the cavity of the package resulting in reliability issues. Further limitations and disadvantages of conventional and traditional approaches will become apparent to one of ordinary skill in the art, through comparison of such approaches with the present disclosure and reference to the drawings.

Accordingly, it is desirable to have a package structure and a method that provides a packaged electronic device that overcomes the shortcomings of the prior art. It is also desirable for the structure and method to be easily incorporated into manufacturing flows, accommodate multiple die interconnect schemes, and to be cost effective.

BRIEF SUMMARY

The present description includes, among other features, a packaged electronic device structure and associated methods that comprise an electronic device having an active side surface exposed in side surface of an enclosure structure. In some examples, the enclosure structure comprises a molded package body. In other examples, the enclosure structure comprises a lid structure. In both structures, elements, such as conductive interconnect structures are protected from the environment to improve reliability compared to previous devices. The packaged electronic device structures can accommodate multiple die interconnects schemes. The associated methods can be incorporated into standard manufacturing flows to provide cost effective integration.

More particularly, in one example, a method for forming a packaged electronic device structure includes providing a substrate having a major surface. The method includes attaching a first device to the major surface of the substrate. The method includes forming a package body encapsulating a portion of the first device, wherein a side surface of the first device is exposed outside of the package body. In some examples, attaching the first device comprises attaching a semiconductor device having an emitter region as part of the side surface of the semiconductor device exposed outside of the package body. In some examples, the method includes attaching a second device to the major surface spaced apart from the first device to provide a gap between the first device and the second device; and forming the package body comprises forming the package body such that the gap is devoid of the package body.

In another example, a packaged electronic device structure includes a substrate having a major surface. A semiconductor device is connected to the major surface of the substrate, the semiconductor device having a first major surface, a second major surface opposite to the first major surface, and a side surface extending between the first major surface and the second major surface. A package body encapsulates a portion of the semiconductor device, wherein the side surface of the semiconductor device is exposed through a side surface of the package body. In some examples, the package body comprises a molded structure that contacts and overlaps the first major surface of the semiconductor device. In other examples, the structure further includes a conductive interconnect structure electrically connecting the semiconductor device to the substrate, and the package body encapsulates the conductive interconnect structure.

In a further example, a method for forming a packaged electronic device structure includes providing a substrate having a major surface. The method includes attaching a semiconductor device to the major surface of the substrate, the semiconductor device having a first major surface, a second major surface opposite to the first major surface, and a side surface extending between the first major surface and the second major surface. The method includes electrically connecting the semiconductor device to the substrate with a conductive interconnect structure. The method includes covering the conductive interconnect structure and at least a portion of the first major surface of the semiconductor device with a protective material. The method includes attaching a lid structure to the substrate, the lid structure comprising sides, a top, and an opening, wherein the side surface of the semiconductor device is exposed outside of the lid structure through the opening. In some examples, the substrate and the lid structure comprise similar materials. In other examples, attaching the lid structure includes attaching the sides to the major surface of the substrate; and attaching the top to the sides; and the method further includes removing a portion of the lid structure to provide the opening after the lid structure is attached to the substrate.

Other examples are included in the present disclosure. Such examples may be found in the figures, in the claims, and/or in the description of the present disclosure.

Figure 1:
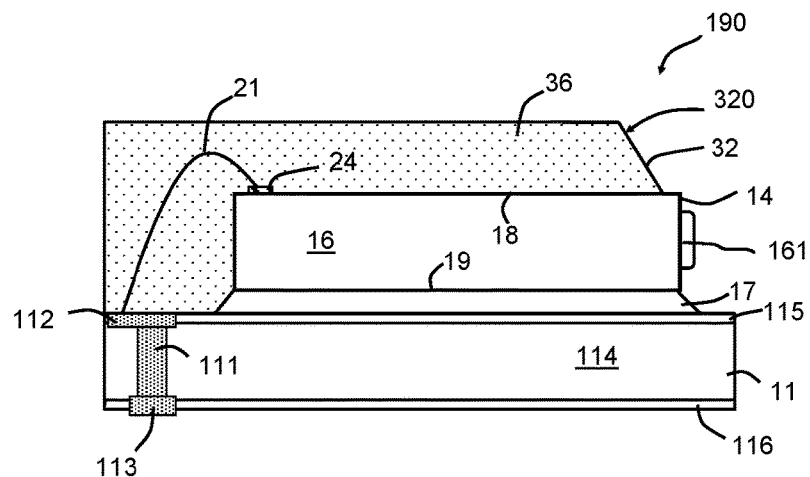
FIG. 1 illustrates a cross-sectional view of an example packaged electronic device of the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular example embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one example" or "an example" means that a particular feature, structure or characteristic described in connection with the embodiment is included in at least one example of the present invention. Thus, appearances of the phrases "in one example" or "in an example" in various places throughout this specification are not necessarily all referring to the same example, but in some cases it may. Furthermore, the particular features, structures or characteristics may be combined in any suitable manner, as would be apparent to one of ordinary skill in the art, in one or more example embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the examples illustrated and described hereinafter suitably may have examples and/or may be practiced in the absence of any element that is not specifically disclosed herein.

DETAILED DESCRIPTION OF THE DRAWINGS

FIG. 1 illustrates a cross-sectional view of an example packaged electronic device structure 10, such as a packaged semiconductor device 10 in accordance with the present description. The example is illustrated as a land grid array packaged semiconductor device structure, but the description is not limited to this type of package and is suitable for other types of packages. In the example illustrated in FIG. 1, packaged electronic device structure 10 comprises a substrate 11, an electronic component 16, such as a semiconductor device 16, an attachment material 17, conductive interconnect structure(s) 21, and an enclosure structure, such as a package body 36. In accordance with the present description and the present example, semiconductor device 16 includes a side surface 14, which can be an active surface that is exposed to through an opening or passage in or through a side surface 32 of enclosure structure 36.

Conductive interconnect structures 21, substrate 11, attachment material 17, and package body 36 can be referred to as a semiconductor package 190, and semiconductor package 190 can provide protection for portions semiconductor device 16 from external elements and/or environmental exposure. In addition, semiconductor package 190 can provide electrical coupling from external electrical components (not shown) to conductive interconnect structures 21 and semiconductor device 16.

Substrate 11 can be selected from common circuit boards (for example, rigid circuit boards and flexible circuit boards), multi-layer substrates, laminate substrates, core substrates with build-up layers, coreless substrates, ceramic substrates, lead frame substrates, molded lead frame substrates, or similar substrates as known to one of ordinary skill in the art. In this regard, the present description is not intended to be limited to any particular type of substrate 11. By way of example and not by way of limitation, the substrate 11 may include an insulating structure 114 having opposed, generally planar top and bottom surfaces. It is understood that multiple insulating layer portions can be used to provide insulating structure 114. An electrically conductive pattern 112 or conductive pattern layer 112 can be disposed adjacent to the top surface of insulating structure 114, and conductive lands 113 can be disposed adjacent to the bottom surface of insulating structure 114.

In some examples, conductive pattern 112 and conductive lands 113 are electrically interconnected to each other in a prescribed pattern or arrangement using conductive interconnect paths 111, defined by portions of one or more conductive layers, that extend through the insulating structure 114 from conductive pattern 112 to conductive lands 113. Conductive pattern 112, conductive lands 113, and conductive interconnect layers 111 comprises conductive materials, such as one or more metals. In some examples, conductive pattern 112, conductive lands 113, and conductive interconnect layers 111 comprise copper. In some examples, a solder mask 115 or protective layer 115 can be provided adjacent to at least portions of conductive pattern 112 and the top surface of insulating structure 114. In addition, in some examples a solder mask 116 or protective layer 116 can be provided on at least portions of the lands 113 and the bottom surface of insulating structure 114. The solder mask 115 is used to protect portions of conductive pattern 112 that would otherwise be susceptible to electrical shorting issues. The solder mask 116 is used to protect portions of the lands 113 that would otherwise be exposed to the ambient environment.

Semiconductor device 16 includes a first major surface 18 where active devices and/or passive devices typically are provided, an opposing second major surface 19, and a side surface 14 that extends generally perpendicularly between first major surface 18 and second major surface 19. Major surface 19 of semiconductor device 16 can be attached to substrate 11 in a device active region up (or die up) configuration using attachment material 17, which can comprise a thermally conductive and electrically conductive material, or a thermally conductive and electrically non-conductive material. In some examples, attachment material 17 comprises an epoxy-type die attach material. In other examples, attachment material 17 can be a solder material, such as a solder paste or other materials as known to one of ordinary skill in the art. Attachment material 17 typically functions to both provide mechanical fixation of semiconductor device 16 to substrate 11 and to dissipate heat generated by semiconductor device 16. In some examples, attachment material 17 can provide an electrical path from substrate 11 to semiconductor device 16.

In some examples, semiconductor device 16 includes bond pads 24 disposed adjacent to major surface 18. In some examples, conductive interconnect structures 21 electrically connect bonds pads 24 to portions of conductive pattern 112. In the present example, conductive interconnect structures 21 comprise conductive wires, and can be provided using wire bonding techniques with wire comprising copper, gold, aluminum, or other conductive materials as known to one of ordinary skill in the art. Conductive interconnect structures 21 function to transmit electrical signals to and from semiconductor device 16. In other examples, semiconductor device 16 can be attached to a portion of conductive pattern 112 with different conductive interconnect structures, such as conductive bumps in a flip-chip configuration with major surface 18 facing substrate 11.

In the present example, conductive lands 113 can be configured to directly connect or attach to a next level of assembly, such as a printed circuit board. In some examples, conductive interconnect structures can be attached to conductive lands 113 in a ball-grid array (BGA) configuration, and can comprise conductive materials, such as solder balls, solder bumps, copper bumps, nickel gold bumps, or similar materials as known to one of ordinary skill in the art.

In some examples, semiconductor device 16 is an optical device, such as a laser device that includes an emitter region 161 disposed proximate to side surface 14 of semiconductor device 16. It is understood that emitter region 161 may be disposed entirely within or partially within semiconductor device 16. Examples of such laser devices can include edge emitting laser (EEL) devices. In other examples, semiconductor device 16 is an integrated circuit device, a power semiconductor device, an optical device, any type of sensor device, or other devices as known to one of ordinary skill in the art particularly devices requiring that one or more side surfaces of the device be exposed in a side surface (e.g., side surface 32) of package body 36. One of ordinary skill in the art will appreciate that semiconductor device 16 is illustrated in simplified form, and may further include multiple diffused regions, multiple conductive layers, and multiple dielectric layers.

Packaged semiconductor device 10 further includes enclosure structure 36, such as package body 36 that covers or encapsulates conductive interconnect structures 21, portions of semiconductor die 16, conductive pattern 112, and portions of substrate 11. In accordance with the present example, package body 36 is provided so that side surface 14 of semiconductor device 16 exposed to the outside of packaged semiconductor device 10. In some examples, package body 36 does not extend along the side surface of substrate 11 or along the bottom surface of substrate 11.

In some examples, package body 36 can be polymer based composite material, such as epoxy resin with filler, epoxy acrylate with filler, or polymer with proper filler. Package body 36 comprises a non-conductive and environmentally protective material that protects conductive interconnect structures 21 and portions of semiconductor device 16 from external elements and contaminants. Package body 36 may be formed using paste printing, compressive molding, transfer molding, over-molding, liquid encapsulant molding, vacuum lamination, other suitable applicator, or other processes as known to those of skill in the art. In some embodiments, package body 36 is an epoxy mold compound ("EMC") and can be formed using transfer or injection molding techniques.

In accordance with the present example, the configuration of package body 36 facilitates exposing side surface 14 of semiconductor device 16 including, for example, emitter region 161 to the outside of package body 36 through side surface 32. In some examples, side surface 32 comprises a sloped or tapered shape 320 as generally illustrated in FIG. 1, which can provide for a more efficient and reliable manufacturing process. In addition, package body 36 functions to protect conductive interconnect structures 21, portions of semiconductor device 16 including bond pads 24, and portions of conductive pattern 112 thereby improving reliability over previous packaged devices where some or all of these features are exposed to the environment. In some examples, package body 36 contacts semiconductor device 16 and laterally overlaps more than 50% of major surface 18 of semiconductor device 16. In other examples, package body 36 contacts semiconductor device 16 and laterally overlaps more than 75% of major surface 18.

Figure 2:
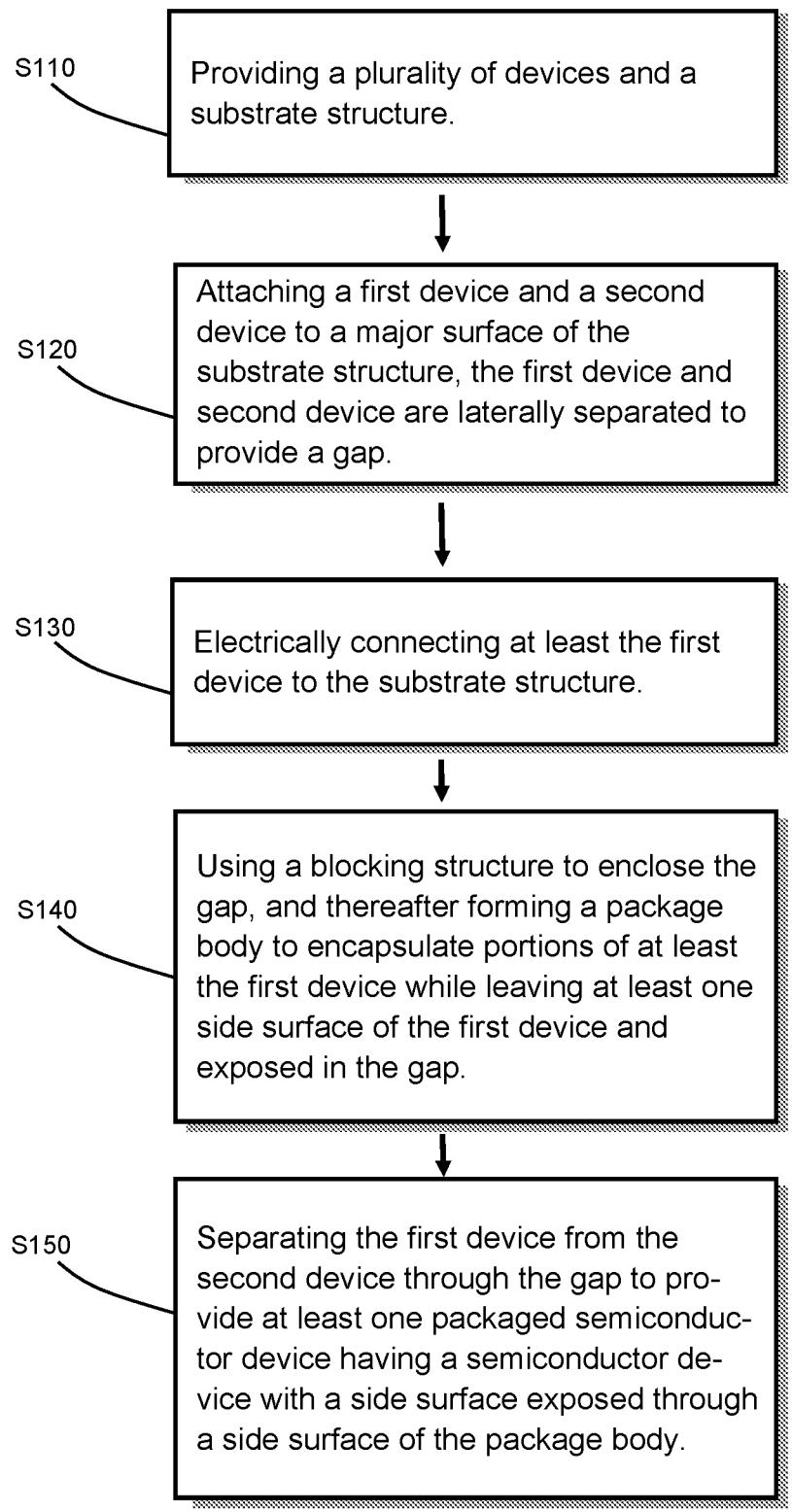
FIG. 2 is a flow chart of an example method of forming a packaged electronic device of the present description.

FIG. 2 is a flow chart illustrating an example method 100 for manufacturing packaged electronic devices, such as packaged semiconductor devices 10 in accordance with the present description. In a Block S110 of method 100, a plurality of devices and a substrate structure are provided. The plurality of devices can include one or more semiconductor devices as well as other devices. In a Block S120 of method 100, the plurality of devices, which includes a first device and a second device, are attached to a major surface of the substrate structure so that the first device and the second device are laterally separated to provide gap or cavity between them.

Figure 3:
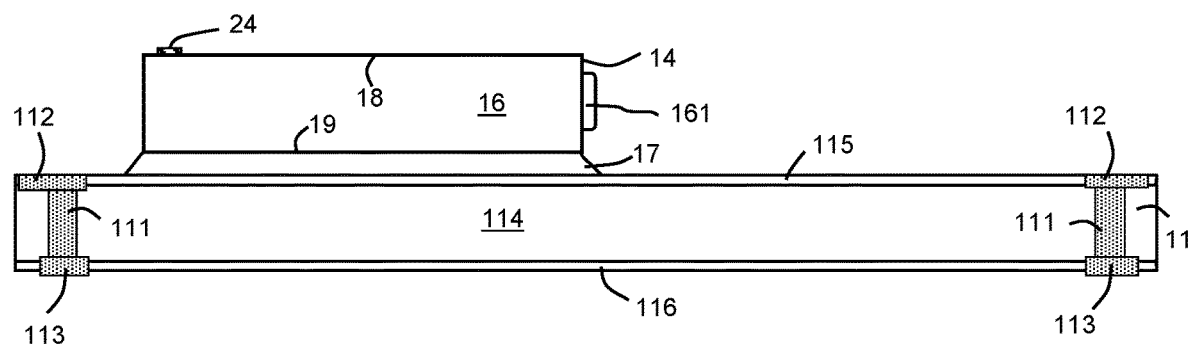
FIGS. 3-7 illustrate partial cross-sectional views of the packaged electronic device of FIG. 1 at various stages of manufacture in accordance with the present description.
Figure 4:
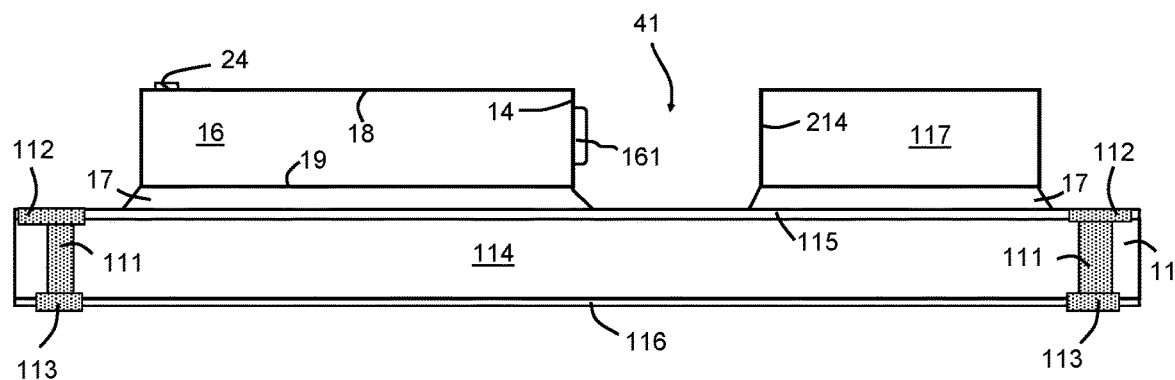

FIGS. 3 and 4 illustrate partial cross-sectional views of packaged semiconductor device 10 at stages of manufacture, and further illustrate an example of Block S110 and Block S120 of method 100. In the present example, the plurality of devices provided can include one or more semiconductor devices, such as semiconductor devices 16 (or variations thereof) as well as other devices, such as a dummy device 117 (or variations thereof), which is illustrated in FIG. 4. The substrate structure provided can be similar to substrate 11 of FIG. 1 (or variations thereof or other substrate structures). In one example, the first device can be one of semiconductor devices 16, which is attached to a surface of substrate 11 with attachment material 17 as part of Block S120. As described previously, attachment material 17 can be an epoxy-type die attach material, which can be deposited onto one or more predetermined portions of substrate 11. In other examples, attachment material 17 can comprise a solder material or other materials as known to one of ordinary skill in the art. In the present example, semiconductor device 16 comprises a sensor device having a side surface 14 that is an active surface or active part of semiconductor device 16. By way of example, semiconductor device 16 is a laser device having emitter region 161 disposed on, within, or as part of side surface 14. In some examples, the attachment material 17 can be cured after semiconductor device 16 is placed into contact with attachment material 17.

In the present example, the second device comprises dummy device 117 as illustrated in FIG. 4, which can be an unprocessed chip or die comprising a semiconductor material. In some examples, dummy device 117 has a similar thickness to semiconductor device 16, but dummy device 117 can have a smaller area than that of semiconductor device 16 to consume less area on substrate 11. In one example, dummy device 117 is an unprocessed or minimally processed silicon die. In Block S120, the second device, such as dummy device 117 is attached to substrate 11. In some examples, attachment material 17 (or other materials) can be used to attach dummy device 117 to substrate 11. In accordance with the present description, semiconductor device 16 and dummy device 117 are disposed on substrate 11 so as to be laterally spaced apart from each other to provide a gap 41, cavity 41, or lateral space 41 between them. In the present example, dummy device 117 has a side surface 214 that directly faces or overlaps side surface 14 of semiconductor device 16 to define at least a portion of gap 41.

Figure 5:
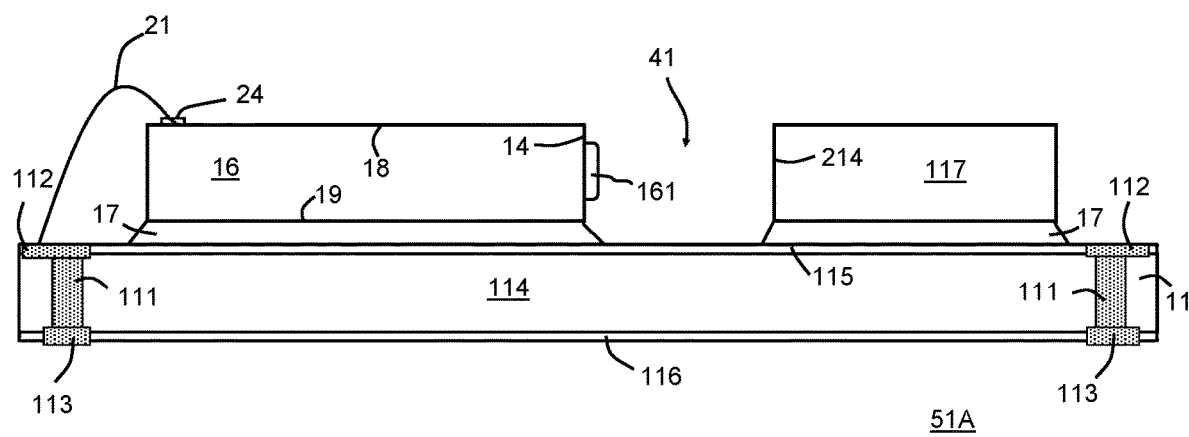

Method 100 also includes a Block S130, which comprises electrically connecting at least the first device to the substrate structure. FIG. 5 illustrates a partial cross-sectional view of packaged semiconductor device 10 at a further stage of manufacture and further illustrates an example of Block S130 of method 100. In some examples, the step of electrically connecting can be done using conductive wires configured as conductive interconnect structures 21, which can be provided using wire bonding techniques. In some examples, conductive interconnect structures 21 are attached to bond pads 24 disposed adjacent to major surface 18 of semiconductor device 16 and to conductive pattern 112. In other examples, semiconductor device 16 can be attached to substrate 11 in a flip-chip configuration with the conductive interconnect structures comprising conductive bump structures, such as solder bumps. In this alternative configuration, it is not necessary to attach dummy die 117 to substrate 11 in a flip-chip configuration, but it can be attached in a flip-chip configuration as a matter of design choice. That is, dummy die 117 can still be attached to substrate 11 with attachment material 17 when semiconductor device is attached to substrate 11 with conductive bumps. In this example, semiconductor device 16 and dummy die 117 are attached to substrate 11 using different means. When flip-chip interconnects are used, the step of attaching the first device and electrically connecting the first device to the substrate structure can be a combined step. In some examples, an optical inspection step can be done at this point in the manufacturing process to ensure that the sub-assembly is properly formed.

At this stage of manufacture, a sub-assembly 51A is provided; and it is understood that although only one semiconductor device 16 and one dummy device 117 is illustrated, sub-assembly 51A can include many (i.e., more than one) semiconductor devices 16 and many (i.e., more than one) dummy devices 117. It is further understood that the order in which semiconductor device 16 and dummy devices 117 are attached to substrate 11 can be different than the sequence illustrated. In addition, conductive interconnect structure 21 can be attached to semiconductor device 16 and conductive pattern layer 112 before dummy device 117 is attached to substrate 11.

Figure 6:
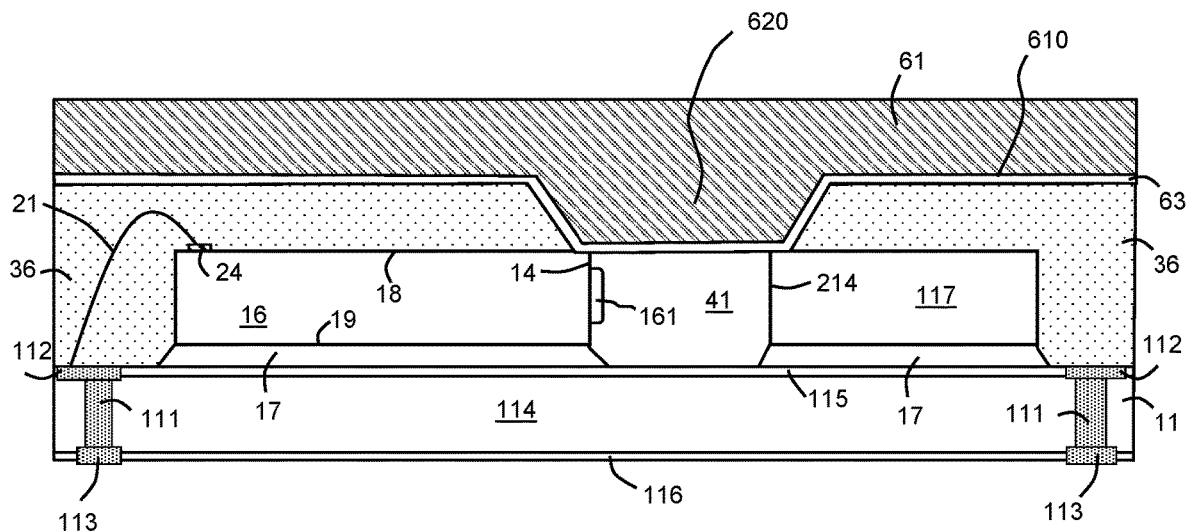

Method 100 further includes a Block S140, which comprises using a blocking structure to enclose or cover the gap, and thereafter forming a package body to encapsulate portions of at least the first device while leaving at least one side surface of the first device exposed in the gap and not covered by the package body. In some examples, at least portions of the second device are encapsulated by the package body while at least one side surface of the second device is exposed in the gap and not covered by the package body. FIG. 6 illustrates a partial cross-sectional view of sub-assembly 51A after further processing in accordance with Block S140 of method 100. In some examples, sub-assembly 51A is placed in molding apparatus, which includes a support structure (not shown) for holding substrate 11 and a blocking device, such a mold chase tool 61 having a protruding portion 620 configured to enclose or cover gap 41 between semiconductor device 16 and dummy device 117. In some examples, a film assisted molding technique is used with Block S140. For example, a protective film 63 is disposed on an outer surface 610 of mold chase tool 61. In some examples, protective film 63 comprises a plastic material or similar materials as known to one of ordinary skill in the art.

Figure 7:
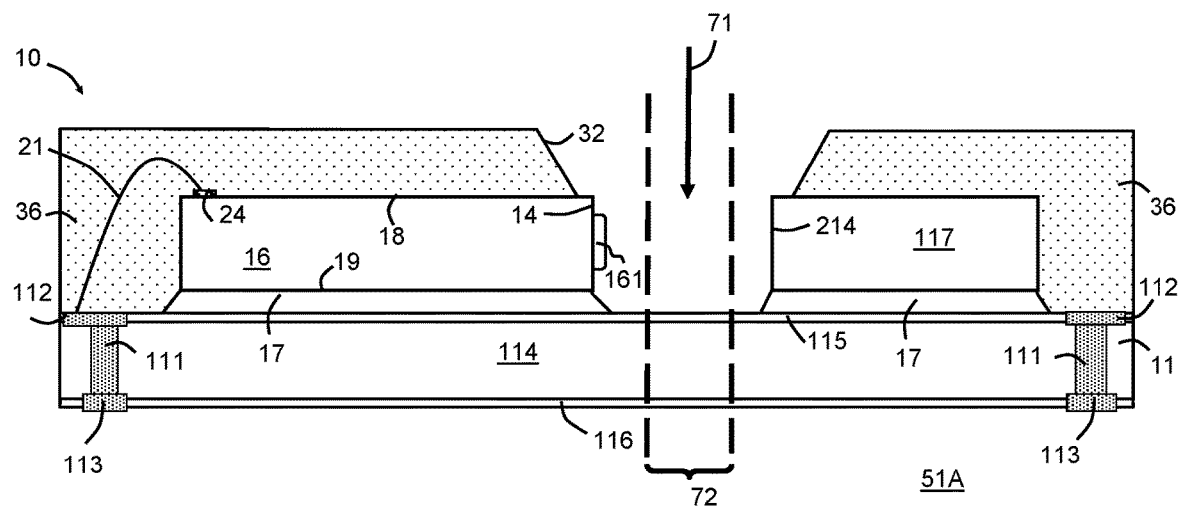

In some examples, portion 620 of mold chase tool 61 has width wider than gap 41 so that portion 620 completely extends across gap 41 and overlaps portions of major surface 18 of semiconductor device 16 and a portion of dummy device 117. The amount of overlap determines where package body 36 terminates along major surface 18 of semiconductor device 16. In some examples portion 620 with protective film 63 is brought into contact with semiconductor device 16, dummy device 117, and a portion of substrate 11 (not shown) to form a seal around gap 41. Next, package body 36 is provided using molding techniques. In accordance with the present example, package body 36 is provided to encapsulate or cover portions of semiconductor device 16 and dummy device 117 while side surface 14 of semiconductor device 16 and side surface 214 of dummy device 117 are left exposed in gap 41 and not covered by package body 36. That is, at least side surface 14 of semiconductor device 16 is not covered by package body 36 and is exposed through an opening or passage in side surface 32 of package body 36 as illustrated in FIGS. 1 and 7.

In some examples, that portion of substrate 11 that is disposed within gap 41 is not covered by package body 36. In some examples, the shape or contour of portion 620 defines the shape of side surface 32 of package body 36. Such shapes can include, for example, sloped shape 320 as illustrated in FIG. 1, or other shapes. In other examples, other blocking structure can be used, such as masking structures that enclose gap 41 during the molding process.

Block S150 of method 100 comprises separating the first device from the second device through the gap to provide at least one packaged semiconductor device with a side surface exposed through a side surface of the package body. In some examples, a separation process (represented by arrow 71), such as a sawing process or a laser cutting process is used to singulate or physically separate subassembly 51A into individual packaged semiconductor devices, such as packaged semiconductor devices 10. In some examples, the width of gap 41 is selected to provide a safe operating area 72 to accommodate the method used to separate substrate 11 without damaging semiconductor device 16. In other examples, portions (or all of) of dummy device 117 can be removed during the singulation process to allow for a narrower safe operating area 71.

In accordance with the present description, method 100 provides packaged semiconductor device 10 having semiconductor device 16 partially encapsulated by package body 36, which protect portions of semiconductor device 16 and conductive interconnect structures 21 while providing side surface 14, which is an active surface of semiconductor device 16, exposed through a side surface 32 of package body 36.

Figure 8:
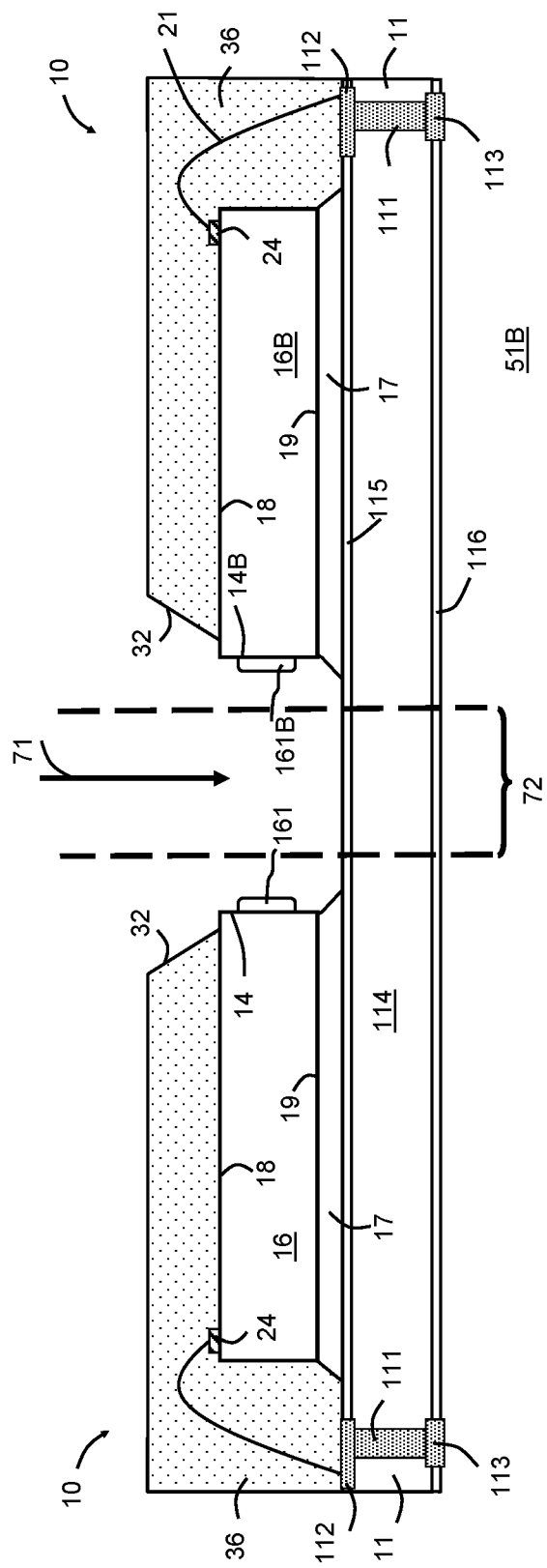
FIG. 8 illustrates a partial cross-sectional view of an example packaged electronic devices of the present description at an intermediate stage of manufacture.

FIG. 8 illustrates a partial cross-sectional view of an example of packaged electronic devices 10 at an intermediate stage of fabrication. In the present example, a sub-assembly 51B has a second device that comprises another semiconductor device 16B instead of dummy device 117. In some examples, semiconductor device 16B is attached to substrate 11 so that side surface 14B, which can be an active surface including an emitter region 161B, of semiconductor device 16B directly faces side surface 14 of semiconductor device 16. During the molding process, the blocking structure overlaps a portion of major surface 18 of semiconductor device 16B.

Figure 9:
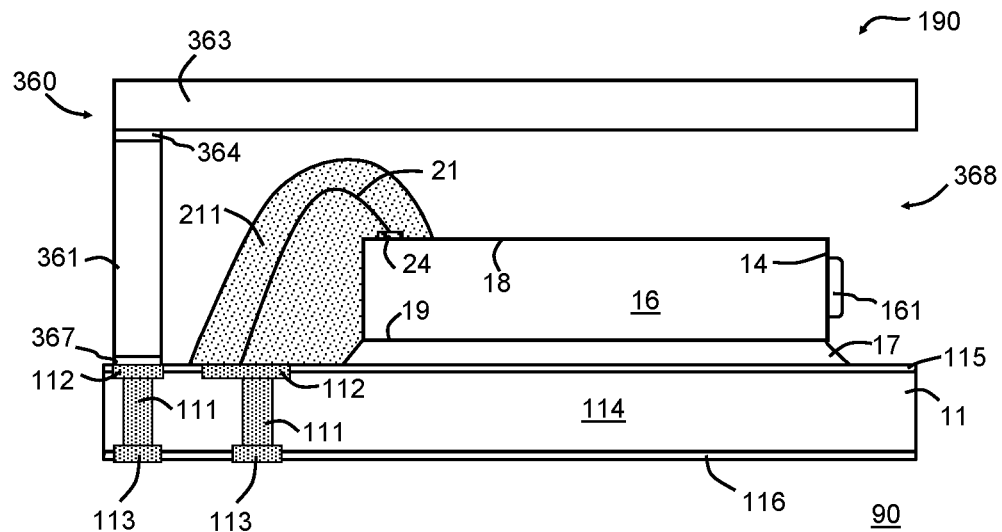
FIG. 9 illustrates a cross-sectional view of an example packaged electronic device of the present description.

FIG. 9 illustrates a cross-sectional view of an example packaged electronic device structure 90, such as a packaged semiconductor device 90 in accordance with the present description. Packaged semiconductor device 90 is another example of a semiconductor package 190 in accordance with the present description. Packaged semiconductor device 90 is similar to packaged semiconductor device 10 and only the differences will be described hereinafter. Packaged semiconductor device 90 comprises a different enclosure structure compared to packaged semiconductor device 10. More particularly, packaged semiconductor device 90 comprises a lid structure 360, which includes sides 361 or side walls 361 and a top 363 attached to sides 361 with an attachment material 364. In some examples, sides 361 are attached to substrate 11 using an attachment material 367. Attachment materials 364 and 367 can comprise electrically conducting and thermally conducting materials, electrically insulating and thermally conductive materials, solder materials, epoxy type adhesive materials, conductive pastes, or other materials as known to one of ordinary skill in the art.

Figure 16:
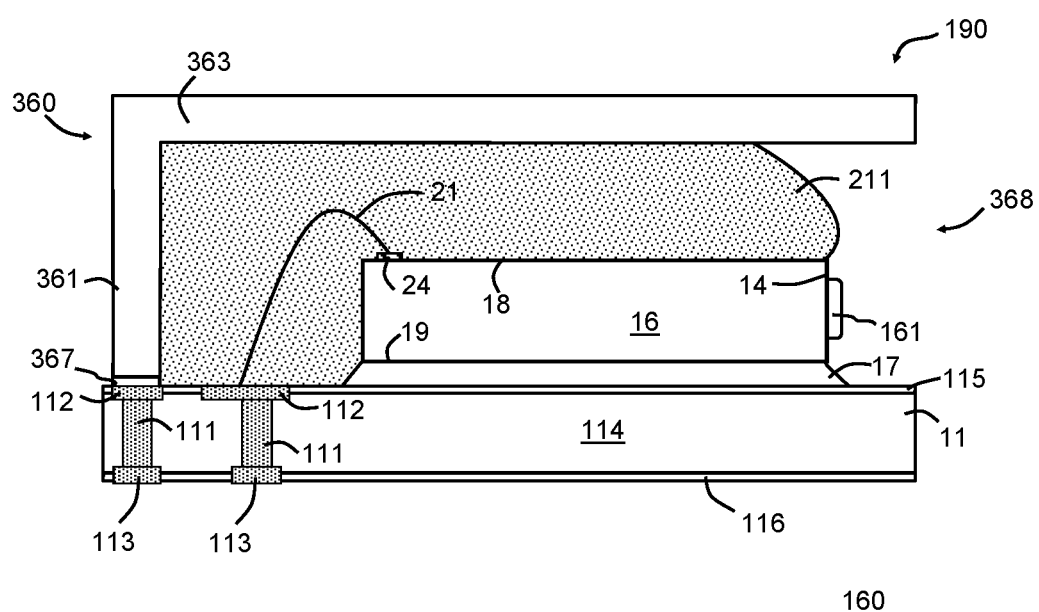
FIG. 16 illustrates a cross-sectional view of an example packaged electronic device of the present description.

In some examples, lid structure 360 comprises a laminate material and can be a material or materials similar to those used to provide substrate 11. In some examples, lid structure 360 comprises an insulating structure. In other examples, lid structure 360 comprises a conductive material or a combination of conductive material(s) and insulating material(s). When lid structure 360 includes a conductive material, lid structure 360 can be configured as a shielding structure for semiconductor device 16, and, in some examples, can be electrically grounded through conductive pattern layer 112, conductive interconnect paths 111, and conductive lands 113 as generally illustrated in FIG. 9. In some examples, lid structure 360 comprises multiple parts as generally illustrated in FIG. 9. In other examples, lid structure 360 comprises a single-piece configuration as generally illustrated in FIG. 16.

In some examples, sides 361 have a height that places top 363 safely above conductive interconnect structures 21, which in the present example are protected or enclosed with a protective material 211. Protective material 211 can comprise a protective gel, such as a polymeric material. In some examples, protective material 211 comprises a silicone gel. Protective material 211 functions to seal, encapsulate and protect conductive interconnect structures 21 and a portion of semiconductor device 16 including, for example, bond pads 24. This is an improvement over prior devices where the conductive interconnect structures are left exposed to the environment, which can result in reliability problems.

In accordance with the present description, lid structure 360 is provided with an opening 368, which exposes active side surface 14 including emitter region 161 of semiconductor device 16 to the outside of lid structure 360. In some examples, top 363 is supported by three sides 361, which are disposed around a perimeter of substrate 11. In other examples, top 363 is supported by at least two sides 361. Sides 361 can be configured to follow the general shape of semiconductor device 16. In other examples, sides 361 can be configured to have a different shape than semiconductor device 16.

Figure 10:
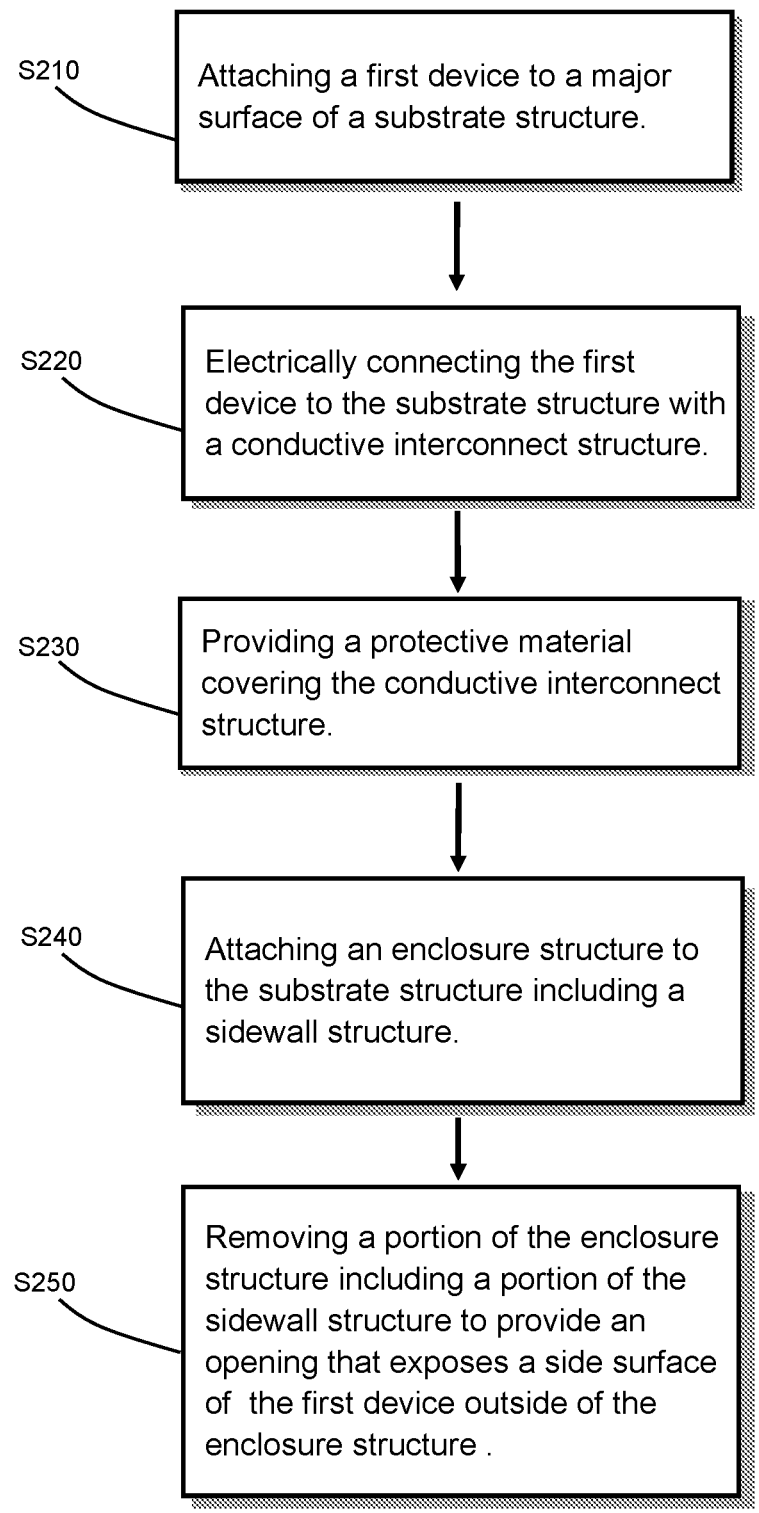
FIG. 10 is a flow chart of an example method of forming a packaged electronic device of the present description.

FIG. 10 is a flow chart illustrating an example method 200 for manufacturing packaged electronic device structures, such as packaged semiconductor devices 90 in accordance with the present description. FIGS. 11-15 illustrate partial cross-sectional views of packaged semiconductor device 90 at various stages of manufacture in accordance with method 200. In a Block S210, a first device is attached to a major surface of a substrate structure.

Figure 11:
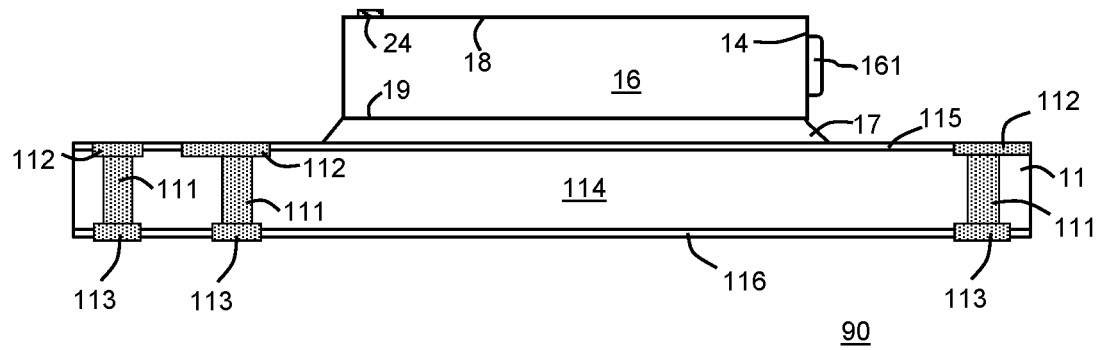
FIGS. 11-15 illustrate partial cross-sectional views of the packaged electronic device of FIG. 9 at various stages of manufacture in accordance with the present description.

FIG. 11 illustrates a partial cross-sectional view of packaged semiconductor device 90 at an early stage of manufacture after completion of Block S210. In some examples, the substrate structure can be similar to substrate 11 of FIG. 9 (or variations thereof or other types of substrates). In some examples, the first device can be semiconductor device 16 (or variations thereof) as well as other devices. As previously described, the first device, such as semiconductor device 16 can be attached to substrate 11 with attachment material 17. In some examples, the attachment material 17 can be cured after semiconductor device 16 is placed into contact with attachment material 17.

Figure 12:
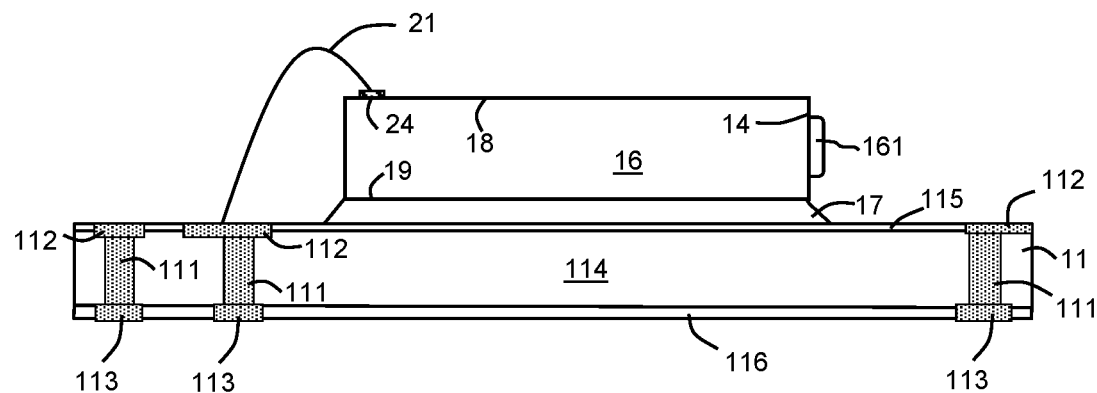

Method 200 also includes a Block S220 comprising electrically connecting the first device to the substrate structure with a conductive interconnect structure. FIG. 12 illustrates a partial cross-sectional view of packaged semiconductor device 90 after completion of Block S220 in accordance with one example. In some examples, the step of electrically connecting can be done using conductive wires configured as conductive interconnect structures 21, which can be provided using wire bonding techniques. In some examples, conductive interconnect structures 21 are attached to bond pads 24 disposed adjacent to major surface 18 of semiconductor device 16 and to conductive pattern 112. In other examples, semiconductor device 16 can be attached to substrate 11 in a flip-chip configuration with the conductive interconnect structures comprising conductive bump structures, such as solder bumps. In the flip-chip configuration, Blocks S210 and S220 can be combined into a single step.

Figure 13:
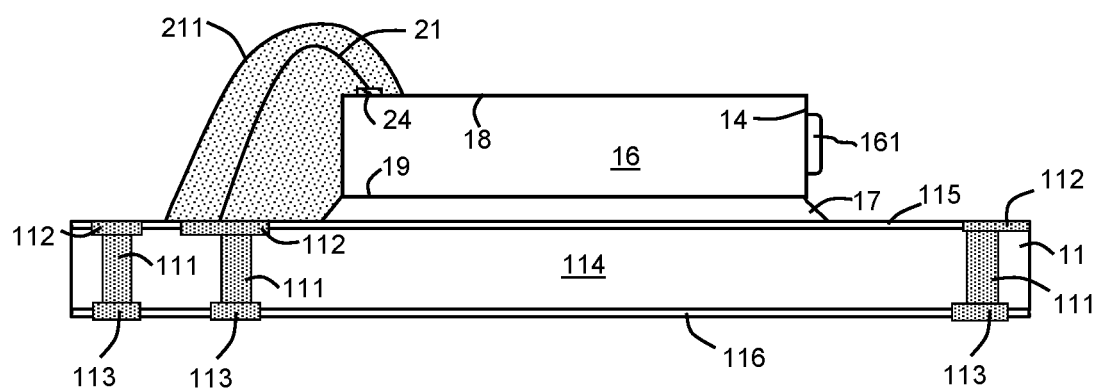

Method 200 further includes a Block S230 comprising providing a protective material covering the conductive interconnect structures. The protective material can be similar to protective material 211 (or variations thereof). FIG. 13 illustrates a partial cross-sectional view of packaged semiconductor device 90 after completion of Block S230 in accordance with one example. In some examples, protective material 211 is provided to cover conductive interconnect structure 21 and can comprise a protective gel material as described previously. A dispensing process can be used to form protective material 211. In some examples, protective material 211 further covers part of semiconductor device 16 including bond pads 24 and further covers a portion of conductive pattern layer 112 where conductive interconnect structure 21 is attached. In some examples, protective material 211 can be cured after it is formed. In some examples, an optical inspection step can be done at this point in the manufacturing process to ensure that the sub-assembly is properly formed.

Figure 14:
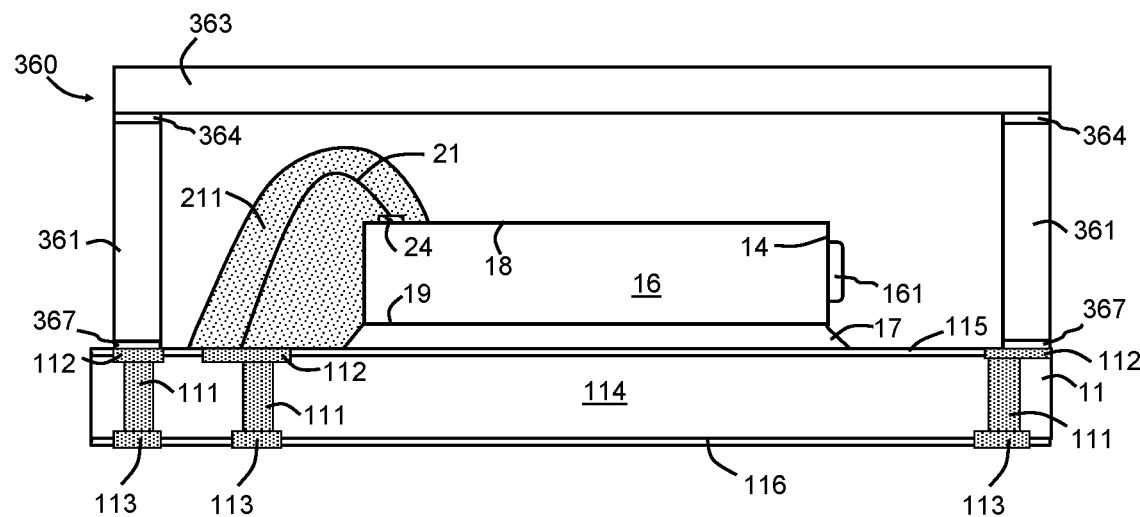

Method 200 includes a Block S240 comprising attaching an enclosure structure to the substrate structure, the enclosure structure including a sidewall structure. The enclosure structure can be similar to lid structure 360 (or variations thereof). FIG. 14 illustrates packaged semiconductor device 90 after completion of Block S240 in accordance with one example. When lid structure 360 comprises multiple parts, sides 361 can be attached first to substrate 11 using attachment material 367. In some examples, one or more sides 361 are attached to conductive pattern layer 112. In one example, attachment material 367 comprises an epoxy-type attachment material. In other examples, attachment material 367 can be a solder material.

After sides 361 are attached, top 363 can be attached to sides 361 using attachment material 364, which can be an epoxy-type attachment material or a solder material. When lid structure 360 comprises a single piece, sides 361 integral with top 363 can be attached to substrate 11 with attachment material 367. In other examples, sides 361 can be attached to top 363 with attachment material 364 before sides 361 are attached to substrate 11 with attachment material 367. In some examples, attachment materials 364 and 367 are cured after sides 361 and top 363 are attached. After Block S140, lid structure 360 can completely enclose semiconductor device 16, conductive interconnect structure 21, and protective material 211. In some examples, after lid structure 360 is attached, top 363 can be marked with identification information. Laser marking can be used for providing the identification information on top 363. With the present configuration, top 363 is supported on all edges by sides 361, which can provide a more stable structure for the laser marking step.

Figure 15:
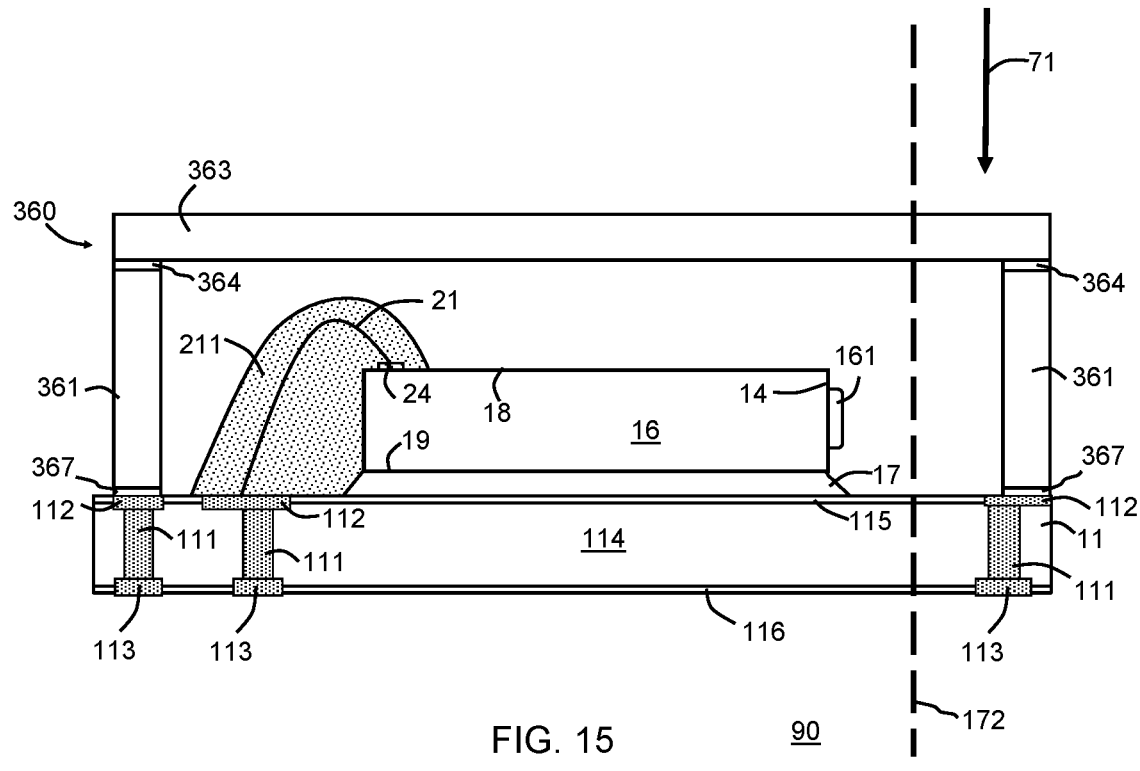

Method 200 further includes a Block S250 comprising removing a portion of the enclosure structure including a portion of the sidewall structure to provide an opening that exposes a side surface of the first device to the outside of the enclosure structure. The removal step can remove a portion of lid structure 360 (or variations thereof) including a portion of a side 361. FIG. 15 illustrates a partial cross-sectional view of packaged semiconductor device 90 in accordance with an example of Block S250. In some examples, a separation process (represented by arrow 71), such as a sawing process or a laser cutting process is used to singulate or physically separate a portion of lid structure 360 and substrate 11 at selected locations (represented by vertical dashed line 172) to expose side surface 14 of semiconductor device 16 through opening 368 of lid structure 360 as generally illustrated in FIG. 9. The location of the separation process is selected so as to not damage semiconductor device 16 during this step.

In accordance with the present description, method 200 provides packaged semiconductor device 90 having protective material 211 covering conductive interconnect structure 21 and semiconductor device 16 with side surface 14 (which is an active surface) exposed through opening 368 in lid structure 360. In addition, when lid structure 360 and substrate 11 comprise similar materials, a packaged semiconductor device with reduced stress can be provided.

FIG. 16 illustrates a cross-sectional view of an example packaged electronic device structure 160, such as a packaged semiconductor device 160 in accordance with the present description. Packaged semiconductor device 160 is another example of a semiconductor package 190 in accordance with the present description. Packaged semiconductor device 160 is similar to packaged semiconductor device 90, and only the differences will be described hereinafter. Lid structure 360 illustrated in FIG. 16 comprises a single piece construction where sides 361 are integral with top 363. In addition, protective material 211 is provided so as to cover most of semiconductor device 16 while leaving side surface 14 uncovered and exposed through opening 368. In other examples, a lens structure can be provided within opening 368. In semiconductor device 160, protective material 211 can be provided before or after lid structure 360 is attached to substrate 11. In some examples, lid structure 360 physically contacts protective material 211. In other examples, one or more spaces or gaps may be provided between protective material 211 and lid structure 360 or portions thereof (e.g., a space between top 363 and protective material 211 and/or a space between sides 361 and protective material 211).

In summary, a packaged electronic device structure and associated methods have been described that comprise an electronic device having an active side surface exposed in a side surface of an enclosure structure. In some examples, the enclosure structure comprises a molded package body. In other examples, the enclosure structure comprises a lid structure. In both structures, elements, such as conductive interconnect structures are protected from the environment to improve reliability compared to previous devices. The packaged electronic device structures can accommodate multiple die interconnects schemes. The associated methods can be incorporated into standard manufacturing flows to provide cost effective integration.

While the subject matter of the invention is described with specific example steps and example embodiments, the foregoing drawings and descriptions thereof depict only typical examples of the subject matter, and are not therefore to be considered limiting of its scope. It is evident that many alternatives and variations will be apparent to those skilled in the art. By way of example, multiple electronic devices can be attached to a pad in side-by-side configurations, in stacked configurations, combinations thereof, or other configurations known to those skilled in the art. In addition, the lid structure for packaged semiconductor device 90 can be provided with a pre-existing opening before it is attached to the substrate structure.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A packaged semiconductor device, comprising:
a substrate having a first substrate surface;
a semiconductor device connected to the first substrate surface, the semiconductor device having a first major surface, a second major surface opposite to the first major surface, and a side surface extending between the first major surface and the second major surface, wherein the semiconductor device comprises an optical device and the side surface of the semiconductor device includes an emitter region, and wherein:

the side surface comprises a first side proximate to a first outer side surface of the substrate and a second side distal the first outer side surface of the substrate; and the first side includes the emitter region;

a conductive interconnect structure electrically connecting the semiconductor device to the substrate; and an encapsulated package body covering at least a portion of the first substrate surface and covering the semiconductor device, wherein the emitter region is exposed outside of the encapsulated package body, and wherein:

the encapsulated package body covers and contacts the second side; and the encapsulated package body contacts the first major surface of the semiconductor device including a corner edge of the semiconductor device adjoining the first major surface and the second side.

2. The device of claim 1, wherein:
the first side is exposed outside of the packaged semiconductor device; and
the encapsulated package body encapsulates the conductive interconnect structure.

3. The device of claim 1, wherein:
the encapsulated package body covers more than 50% but less than 100% of the first major surface of the semiconductor device.

4. The device of claim 1, wherein:
the encapsulated package body covers more than 75% but less than 100% of the first major surface of the semiconductor device.

5. The device of claim 1, wherein:
the second side of the side surface of the semiconductor device is an inactive side.

6. The device of claim 1, wherein:
the substrate comprises a second outer side surface opposite to the first outer side surface;
the encapsulated package body comprises a first package body side surface proximate to the first side of the semiconductor device;
the first package body side surface comprises a tapered shape;
the encapsulated package body comprises a second package body side surface opposite to the first package body side surface; and
the second package body side surface is substantially co-planar with the second outer surface of the substrate.

7. The device of claim 1, wherein:
the encapsulated package body comprises an epoxy material.

8. The device of claim 1, wherein:
the substrate comprises:
an insulating structure comprising the first substrate surface and a second substrate surface opposite to the first substrate surface;
a conductive pattern layer adjacent to the first substrate surface;
conductive lands adjacent to the second substrate surface; and
conductive interconnect paths electrically coupling the conductive pattern to the conductive lands.

9. The device of claim 1, wherein:
the first outer side surface of the substrate proximate to the first side of the semiconductor device comprises a singulated surface; and
the first side of the semiconductor device is positioned over the first substrate surface laterally inward from the singulated surface so that a portion of the first substrate surface is interposed between the first side of the semiconductor device and the singulated surface.

10. A packaged electronic device, comprising:
a substrate having a major surface, a first side, and a second side opposite to the first side;
an electronic component coupled to the substrate, the electronic component having a first major surface, a second major surface opposite to the first major surface, and a side surface extending between the first major surface and the second major surface, wherein the side surface comprises an active surface proximate to the first side of the substrate;
a conductive interconnect structure electrically coupling the electronic component to the substrate; and
a package body encapsulating the conductive interconnect structure, encapsulating at least a portion of the major surface of the substrate, and encapsulating the electronic component, wherein:
the active surface and a portion of the first major surface of the electronic component proximate to the active surface are exposed outside of the package body;
the electronic component is coupled to the major surface of the substrate so that the active surface of the electronic component is laterally inward from the first side so that a portion of the major surface of the substrate is interposed between the first side and the active surface.

11. The device of claim 10, wherein:
the side surface of the electronic component comprises an inactive side that is distal to the active side;
the package body contacts the inactive side; and
the electronic component comprises an optical component having an emitter adjacent to the active surface.

12. The device of claim 10, wherein:
the package body contacts the electronic device; and
the package body covers more than 50% but less than 100% of the first major surface of the electronic component.

13. The device of claim 10, wherein:
the package body comprises a package body side surface proximate to the active surface of the electronic component; and
the package body side surface comprises a tapered shape.

14. The device of claim 10, wherein:
the first side of the substrate proximate to the active surface of the electronic component comprises a singulated surface.

15. The device of claim 10, wherein:
the substrate comprises:
an insulating structure comprising the major surface and a second major surface opposite to the major surface;
a conductive pattern layer adjacent to the major surface;
conductive lands adjacent to the second major surface; and
conductive interconnect paths electrically coupling the conductive pattern to the conductive lands; and
the electronic component is directly attached to the major surface.

16. A method, comprising:
providing a substrate having a major surface;
coupling an electronic component to the substrate, the electronic component having a first major surface, a second major surface opposite to the first major surface, and a side surface extending between the first major surface and the second major surface, wherein the side surface comprises an active surface for the electronic component; and encapsulating at least a portion of the major surface of the substrate and the electronic component with a package body to provide a packaged electronic device, wherein at least the active surface is exposed to an outside of the packaged electronic device, wherein:

the electronic component comprises an optical device; and a portion of the first major surface of the electronic component proximate to the active surface is exposed to the outside of the packaged electronic device.

17. The method of claim 16, further comprising:
coupling the electronic component to the substrate, with a conductive interconnect structure, wherein the package body encapsulates the conductive interconnect structure.

18. The method of claim 16, wherein:
the package body directly contacts the electronic component; and
package body covers more than 50% but less than 100% of the first major surface of the electronic component.

19. The method of claim 16, wherein:
the package body comprises a package body side surface proximate to the side surface of the electronic component; and
the package body side surface comprises a sloped shape.

* * * * *